(12) United States Patent
Reynolds et al.

(10) Patent No.: US 12,275,198 B2
(45) Date of Patent: Apr. 15, 2025

(54) COMPOSITE MANUFACTURING USING DATA ANALYTICS

(71) Applicant: The Boeing Company, Chicago, IL (US)

(72) Inventors: Carla E. Reynolds, Shawnee, KS (US); Dustin D. Fast, Owens Crossroads, AL (US); Andrew L. Bauer, Kirkland, WA (US); Troy Winfree, Seattle, WA (US); Steven M. Shewchuk, St. Louis, MO (US); Alexander M. Rubin, Berkeley, MO (US); Samuel J. Tucker, St. Louis, MO (US)

(73) Assignee: The Boeing Company, Chicago, IL (US)

( * ) Notice: Subject to any disclaimer, the term of this patent is extended or adjusted under 35 U.S.C. 154(b) by 488 days.

(21) Appl. No.: 17/674,496

(22) Filed: Feb. 17, 2022

(65) Prior Publication Data

US 2022/0299975 A1  Sep. 22, 2022

Related U.S. Application Data

(60) Provisional application No. 63/163,438, filed on Mar. 19, 2021.

(51) Int. Cl.
*B29C 70/38* (2006.01)
*G05B 19/4097* (2006.01)
(Continued)

(52) U.S. Cl.
CPC .......... *B29C 70/38* (2013.01); *G05B 19/4097* (2013.01); *G05B 19/4145* (2013.01); *G06F 18/214* (2023.01); *G06F 30/15* (2020.01)

(58) Field of Classification Search
CPC ................ B29C 70/38; G05B 19/4097; G05B 19/4145; G06F 18/214; G06F 30/15
See application file for complete search history.

(56) References Cited

U.S. PATENT DOCUMENTS

| | | | | |
|---|---|---|---|---|
| 10,919,285 B2 * | 2/2021 | DehghanNiri | ......... | B33Y 30/00 |
| 11,256,231 B2 * | 2/2022 | Crothers | ............ | G05B 13/0265 |

(Continued)

FOREIGN PATENT DOCUMENTS

| | | | | | |
|---|---|---|---|---|---|
| CN | 111625898 A | * | 9/2020 | ........... | B29C 70/382 |
| EP | 3702982 B1 | * | 10/2023 | ........... | B29C 70/382 |

OTHER PUBLICATIONS

Extended European Search Report issued Aug. 11, 2022, in corresponding European application No. 22162778.9.

(Continued)

*Primary Examiner* — Crystal J Barnes-Bullock
(74) *Attorney, Agent, or Firm* — Yee & Associates, P.C.

(57) ABSTRACT

A method of manufacturing a composite structure includes accessing design data for the composite structure that is manufactured according to a process including forming a layup of plies of fibers using a machine tool. The method includes applying the design data to an ANN classifier to classify a localized inconsistency of a type of inconsistency on the composite structure, the localized inconsistency spatially referenced to a location on the composite structure. The method includes performing a root cause analysis to identify one or more of process parameters as a potential cause of the type of inconsistency, and modifying one or more of the geometric model, the layup design, or values of the one or more of the process parameters to address the potential cause.

24 Claims, 8 Drawing Sheets

(51) Int. Cl.
*G05B 19/414* (2006.01)
*G06F 18/214* (2023.01)
*G06F 30/15* (2020.01)

(56) References Cited

U.S. PATENT DOCUMENTS

2020/0272129 A1  8/2020  Crothers et al.
2020/0324494 A1  10/2020  Wang et al.

OTHER PUBLICATIONS

Serban Alexandru: "Failure Estimation of the Composite Laminates in Layup Optimization Using Finite Element Analysis and Deep Learning", Journal of Failure Analysis and Prevention, Springer, Boston, vol. 20, No. 4, Jul. 24, 2020, pp. 1199-1211, XP037227225.
Spoerre Julie et al: "Integrated product and process design (IPPD) for resin transfer molded (RTM) parts", Applications of Artificial Intelligence in Engineering XI, vol. 16, Dec. 31, 1996, XP055948042.

* cited by examiner

COMPOSITE MANUFACTURING USING DATA ANALYTICS

CROSS-REFERENCE TO RELATED APPLICATION(S)

This application claims priority to U.S. Provisional Patent Application No. 63/163,438, filed Mar. 19, 2021, entitled Composite Manufacturing Using Data Analytics, the content of which is incorporated herein by reference in its entirety.

TECHNOLOGICAL FIELD

The present disclosure relates generally to composite manufacturing and, in particular, to using data analytics for improved composite manufacturing.

BACKGROUND

Composite materials are becoming more prevalent in vehicles, such as aircraft. Some aircraft may have more than, forty percent, fifty percent or more of their primary structure made from composite materials. Composite materials are used in aircraft to decrease the weight of the aircraft. This decreased weight improves performance features, such as payload capacities and fuel efficiencies. Further, composite materials provide longer service life for various components in an aircraft.

Composite materials are tough, light-weight materials, created by combining two or more dissimilar components. For example, a composite may include components such as a reinforcement material (e.g., fibers) and matrix material (e.g., resin) that are combined and cured to form a composite material.

By using composite materials, portions of an aircraft may be created in larger pieces or sections. This is called integrated structure. For example, a fuselage in an aircraft may be created in cylindrical sections that may be put together to form the fuselage of the aircraft. Other examples include, for example, without limitation, wing skins, span-wise stiffeners, spars and chordwise ribs joined to form a wing, stabilizer sections joined to form a stabilizer, a stiffener, a fairing, a control surface, a skin, a skin section, a door, a strut, and a tubular structure.

In manufacturing composite components, the materials are typically formed using a mold with sufficient rigidity to maintain the desired shape for the composite component when the composite materials are applied into a cavity of the mold cavity or onto a surface of the mold. A mold may be metallic or non-metallic in composition to provide rigidity for supporting the composite materials.

Currently, many composites in a manufactured aircraft employ an autoclave to cure the composite components. Resins in pre-impregnated plies of fibers typically need an elevated temperature to achieve a chemical reaction that allows these resins to flow and cure, and an elevated pressure to achieve ply consolidation and expel gases contained within the pre-impregnated plies, known as porosity. With large components, a large autoclave is used to encompass the component and the tool for processing.

Conventional composite manufacturing processes are subject to undesirable errors and inconsistency, which may in turn result in reduced yield, increased scrap and rework, or performance/weight penalties resulting from reduced design allowables (structural knockdowns).

BRIEF SUMMARY

Example implementations of the present disclosure relate generally to composite manufacturing and, in particular, to using data analytics for improved composite manufacturing. Example implementations uses machine learning, with historical observations of the process parameters recorded during manufacture of other units of a composite structure, to optimize manufacture of a unit of the composite structure. The historical observations may include geometry, in-process logs, quality information and the like from prior units, and trained machine learning models may capture the complex interplay between variables to locally optimize process parameters. Some examples may produce locally-optimized computer numerical control (CNC) programming for a machine tool, which may be used to manufacture the composite structure with improved quality.

The present disclosure thus includes, without limitation, the following example implementations.

Some example implementations provide a method of manufacturing a composite structure, the method comprising: accessing design data for the composite structure, the design data including a geometric model of the composite structure, a layup design of a layup of plies of fibers, and values of process parameters according to which the layup is to be formed; applying the design data to an artificial neural network (ANN) classifier to classify a localized inconsistency of a type of inconsistency on the composite structure, the localized inconsistency spatially referenced to a location on the composite structure; performing a root cause analysis to identify one or more of the process parameters as a potential cause of the type of inconsistency; and modifying one or more of the geometric model, the layup design, or the values of the one or more of the process parameters to address the potential cause.

Some example implementations provide an apparatus for manufacturing a composite structure, the apparatus comprising a memory configured to store computer-readable program code; and processing circuitry configured to access the memory, and execute the computer-readable program code to cause the apparatus to at least perform the method of any preceding example implementation, or any combination of any preceding example implementations.

Some example implementations provide a computer-readable storage medium for manufacturing a composite structure, the computer-readable storage medium being non-transitory and having computer-readable program code stored therein that, in response to execution by processing circuitry, causes an apparatus to at least perform the method of any preceding example implementation, or any combination of any preceding example implementations.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

DETAILED DESCRIPTION

Figure 1:
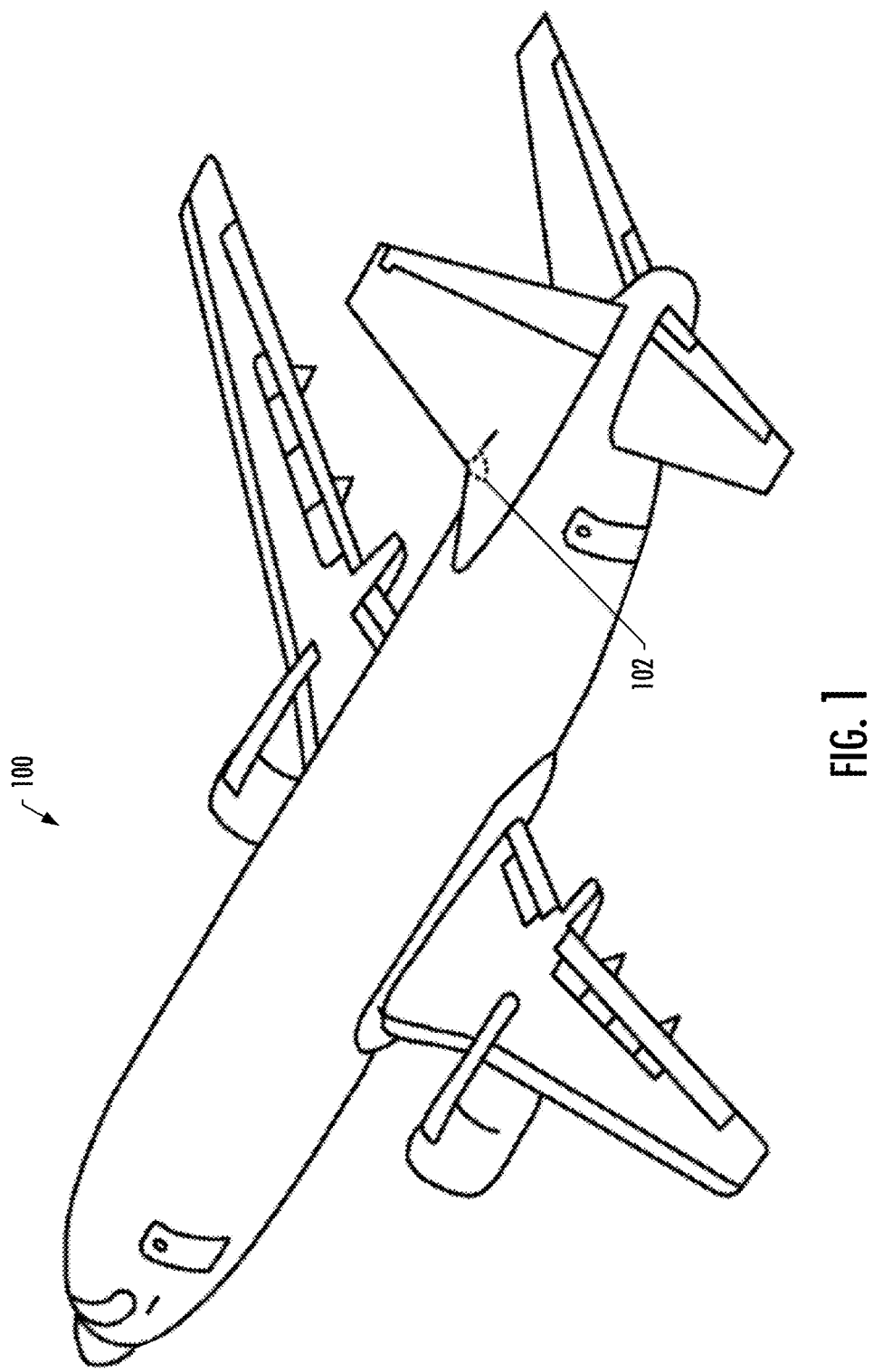
FIG. 1 illustrates an aircraft according to some example implementations of the present disclosure.

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. Like reference numerals refer to like elements throughout.

Unless specified otherwise or clear from context, references to first, second or the like should not be construed to imply a particular order. A feature described as being above another feature (unless specified otherwise or clear from context) may instead be below, and vice versa; and similarly, features described as being to the left of another feature else may instead be to the right, and vice versa. Also, while reference may be made herein to quantitative measures, values, geometric relationships or the like, unless otherwise stated, any one or more if not all of these may be absolute or approximate to account for acceptable variations that may occur, such as those due to engineering tolerances or the like.

As used herein, unless specified otherwise or clear from context, the "or" of a set of operands is the "inclusive or" and thereby true if and only if one or more of the operands is true, as opposed to the "exclusive or" which is false when all of the operands are true. Thus, for example, "[A] or [B]" is true if [A] is true, or if [B] is true, or if both [A] and [B] are true. Further, the articles "a" and "an" mean "one or more," unless specified otherwise or clear from context to be directed to a singular form. Furthermore, it should be understood that unless otherwise specified, the terms "data," "content," "digital content," "information," and similar terms may be at times used interchangeably.

Example implementations of the present disclosure relate generally to composite manufacturing and, in particular, to using data analytics for improved composite manufacturing. Example implementations may be applied to pre-impregnated and resin infused plies for any suitable manufacturing process, including, but not limited to, in-autoclave, out-of-autoclave and/or resin infused processes. The structure may be any of a number of different structures composed of one or more layers (more specifically "plies" in some examples), each of which in some examples may include reinforcement material such as a bed of fibers (at times more simply referred to as a ply or a ply of fibers).

The bed of fibers may be pre-impregnated with a matrix material such as resin, or held together with a binder and to be infused with resin. These composite structures may be composed of a plurality of component elements including, for example, one or more plies of fibers each ply of which may be pre-impregnated with resin or held together with a binder (and to be infused with resin). Examples of suitable structures include composites, laminated composites and the like, such as laminated composites of unidirectional tape plies, layered metallic structures, metallic or composite skin and core (sandwich structures) and the like. These structures may be put to use in a number of different manners, such as on manned or unmanned vehicles (e.g., motor vehicles, railed vehicles, watercraft, aircraft, spacecraft, etc.), an aircraft hangar, office building, bridge, or another type of structure.

FIG. 1 illustrates an aircraft 100 including structures that may be manufactured according to example implementations of the present disclosure. As illustrated, the aircraft that includes an assemblage of multiple components including composite structures such as a composite structure 102 formed as a panel. A number of the components of the aircraft may be manufactured by machine tools at a production facility; or the components may be manufactured at multiple production facilities and transported to a central facility for assembly. As indicated above, although shown in the context of an aircraft, structures manufactured according to example implementations may be put to use on other manned or unmanned vehicles, aircraft hangers, office buildings, bridges or other types of structures.

Figure 2:
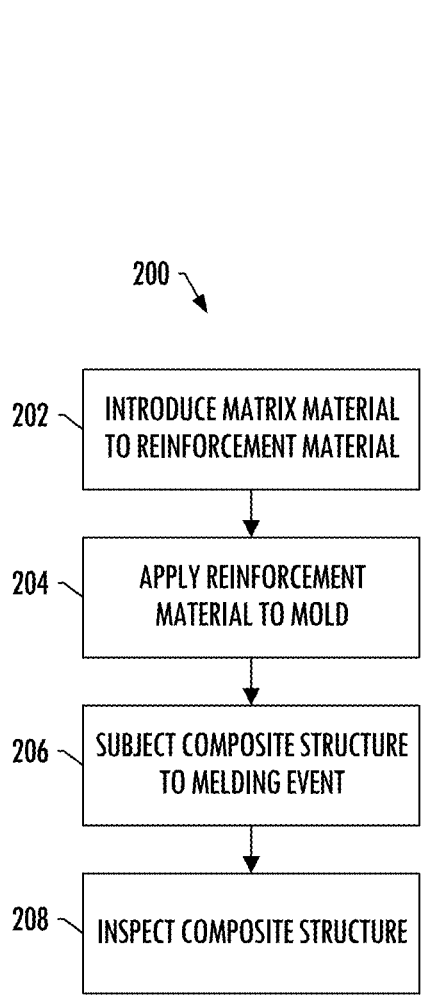
FIGS. 2 and 3 illustrate various operations in methods of manufacturing a composite structure that may benefit from at least some example implementations of the present disclosure.

FIG. 2 illustrates various operations in a process 200 of manufacturing a composite structure that may benefit from at least some example implementations of the present disclosure, although example implementations may be equally applicable to other processes of composite manufacturing. As shown at block 202, the process includes introducing a matrix material such as resin, to a reinforcement material such as a bed of fibers. This may include pre-impregnating the fibers with resin, and forming a tow or tape of the thereby pre-impregnated fibers.

The process 200 includes applying the reinforcement material (e.g., fibers) into a mold cavity or onto a mold surface with a first machine tool, as shown at block 204. In some examples, the reinforcement material is applied onto the mold surface that is a mandrel tool, and the first machine tool is an automated fiber placement (AFP) or automated tape laying (ATL) machine. In these examples, applying the reinforcement material includes applying the tow or tape onto the mandrel tool with the AFP or ATL machine. In this regard, the first machine tool may form a layup of plies of fibers, such as by laying down a feed of fiber tows or tape row-by-row to create a ply, and ply-by-ply to form the layup.

As shown at block 206, the process 200 also includes subjecting the composite structure, including the reinforcement material and the matrix material (e.g., resin), to a melding event with a second machine tool such as an autoclave or oven, to set the composite structure. And as shown at block 208, the process includes inspecting the composite structure to evaluate properties of the composite structure. In some examples, inspection of the composite structure may include nondestructive inspection (NDI). Examples of suitable machine tools useful for inspection of the composite structure include various automated ultrasonic inspection systems as well as measurement systems.

Figure 3:
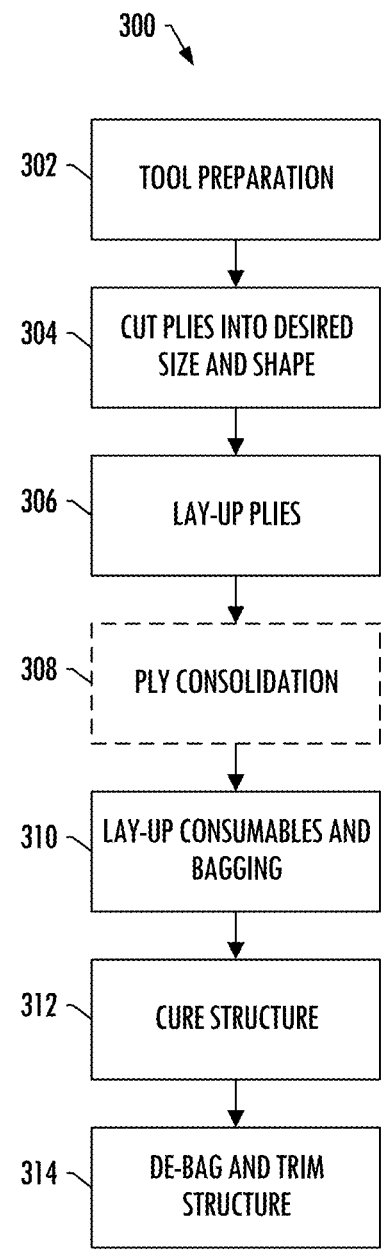

FIG. 3 illustrates more particularly various operations in a process 300 of manufacturing a composite structure that may benefit from at least some example implementations. As shown at block 302, the process may include preparation of a tool (or mold), which may include cleaning and applying a release agent chemical to the tool. One or more plies of fibers may be cut to a desired size and/or shape, and placed onto the tool in their correct order, as shown at blocks 304 and 306. As indicated above, these plies may be pre-impregnated with resin, or held together with a binder and to be infused with resin.

The process 300 may include ply consolidation, as shown at block 308. In the case of pre-impregnated plies, this ply consolidation may include periodic consolidation (debulking) of the plies by sealing the lay-up under a vacuum bag with a layer of permeable material to provide an air path to evacuate volatiles. The debulking may be accomplished by applying full vacuum for a defined period of time (e.g., 5-10 minutes) to consolidate and remove air from the plies.

In the case of resin infusion, ply consolidation is often referred to as pre-forming. This involves laying up the plies, placing the plies under vacuum to form them into the correct shape and taking the plies up to a temperature (e.g., 330° F.) that melts the binder. This sets the plies into the correct shape. In some examples, the plies may be trimmed and then transferred from the pre-forming tooling onto an infusion tool. This pre-forming may more often be performed where the geometry is complex and the plies may not be adequately laid up in-situ.

For both pre-impregnated plies and those to be infused with resin, the process 300 may include a lay-up consumables and bagging step, as shown at block 310. Here, a layer of release film may be placed over the lay-up as a protective barrier over the plies, and a layer of permeable material may be placed over the release film to create an air path. For pre-impregnated plies, this air path may be to remove gases and volatiles from the plies. For plies to be infused with resin, the air path may create a path to infuse resin into the plies (or more specifically their respective beds of fibers). For both types of plies, the lay-up may be covered in a vacuum bag that is sealed air tight to the tool.

The structure may then be cured, as shown at block 312. For pre-impregnated plies, this may include placing the bagged lay-up in an autoclave. For plies to be infused with resin, this may include placing the bagged lay-up in an oven, and connecting the lay-up to a resin source. Pressure and temperature profiles may be applied according to a recommended cure cycle to cure the resin in the case of pre-impregnated plies, or infuse the plies with resin and cure the resin in the case of plies to be infused. After the cure cycle, the composite structure may be de-bagged and trimmed, as shown at block 314. This may include removal of the tool from the autoclave (for pre-impregnated plies) or oven (for resin infusion), and removal of consumables (vacuum bag, permeable material and release film). The cured composite structure may be de-molded from the tool, and trimmed to remove sharp edges and create a desired final shape, which may then be inspected.

As described above in the process 300 of FIG. 3, impregnating or infusing the plies of fibers with resin may correspond to introducing a matrix material to a reinforcement material, as shown at block 202 in the process 200 of FIG. 2. Preparing the tool (block 302), cutting the plies and placing them onto the tool (blocks 304 and 306), ply consolidation (block 308) and lay-up consumables and bagging (block 310) may correspond to applying the reinforcement material into the mold cavity or onto the mold surface, as shown at block 204 in the process 200 of FIG. 2. And curing the structure (block 312) may correspond to subjecting the matrix material to a melding event, as shown at block 206 in the process 200 of FIG. 2.

Example implementations of the present disclosure provides a system and method for improving composite manufacturing, such as process 200, 300. Example implementations may be applied in-process during manufacture of a composite structure to achieve one or more certain defined quality. Example implementations may be applied before, after or during any of a number of different operations of the process of manufacturing a composite structure, or between the manufacture of a composite structure and manufacture of a next composite structure.

Figure 4:
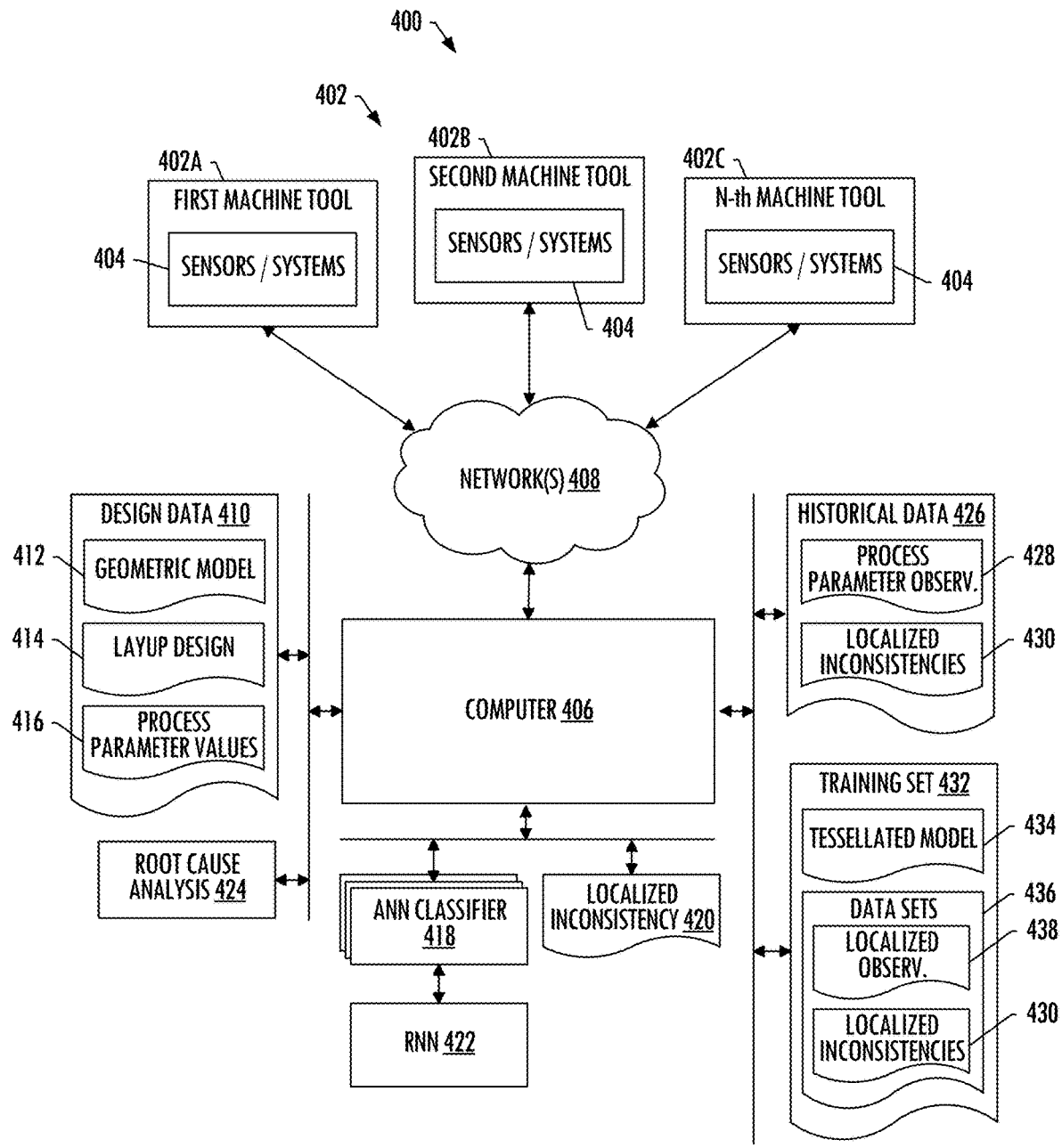
FIG. 4 illustrates a system for manufacturing composite structures, according to some example implementations of the present disclosure.

FIG. 4 illustrates a system 400 for manufacturing composite structures such as composite structure 102, according to some example implementations. The system may include any of a number of different subsystems (e.g., each an individual system) for performing one or more functions or operations. In some examples, the system includes machine tools 402 configured to manufacture a composite structure of the composite structures. As shown, the machine tools include a first machine tool 402A, second machine tool 402B and an n-th machine tool 402C. As explained above, examples of suitable machine tools include a mold such as a mandrel tool, an automated fiber placement (AFP) machine, an automated tape laying (ATL) machine, an infusion tool, an autoclave, an oven, a trim and drill machine, an automated ultrasonic inspection system, measurement system, and the like. One or more of the machine tools may be a computer numerical control (CNC) machine that is controlled according to a CNC program that is executable by the CNC machine.

Figure 5:
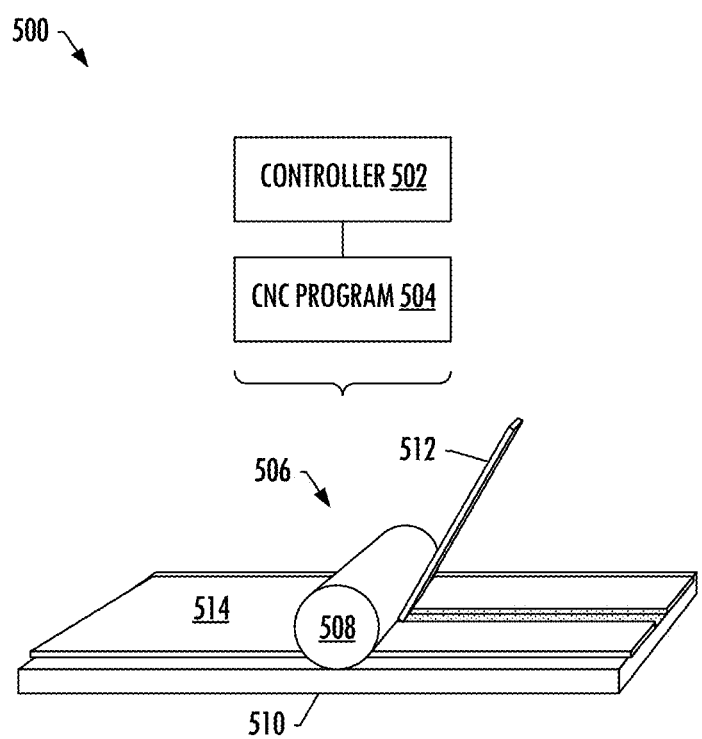
FIG. 5 illustrates a computer numerical control (CNC) machine, according to some example implementations.

As shown in FIG. 5, in a more particular example, one or more of the machine tools such as the first machine tool 402A is an AFP machine, ATL machine or other machine tool designed to form a layup of plies of fibers. As shown in FIG. 5, the machine tool may be a CNC machine 500 including a controller 502 configured to execute a CNC program 504 to form the layup. In this regard, the controller may be configured to execute the CNC program to cause a fiber-placement head assembly 506 including a compaction roller 508 to travel a path over a work surface 510, and heat, lay down and consolidate a feed of fiber tows or tape 512 row-by-row to create a ply, and ply-by-ply to form the layup 514.

Returning to FIG. 4, the machine tools 402 are configured to manufacture the composite structure 102 according to a process such as, but not limited to, processes 200 and/or 300. In this regard, the machine tools are configured to introduce a matrix material to a reinforcement material, and apply the reinforcement material into a mold cavity or onto a mold surface with the first machine tool 402A (e.g., mandrel tool, AFP machine, ATL machine, infusion tool). The machine tools are configured to subject the matrix material to a melding event with a second machine tool 402B (e.g., autoclave, oven) to set the composite structure including the reinforcement material and the matrix material. And the machine tools 402 are configured to inspect the composite structure to evaluate properties of the composite structure.

As also shown, the first machine tool 402A, second machine tool 402B and n-th machine tool 402C include sensors or systems 404 configured to record or report data before, during and/or after manufacture of the composite structure 102. In some examples, this data includes values of process parameters such as those according to which the layup is formed. Process parameters include numerical or other measurable factors that sets conditions according to which the layup is formed. These parameters may include factors subject to one or more sources of variation that cause variation in the layup. Examples of suitable process parameters include fiber placement head assembly compaction force, tension indicating an amount of controlled tension maintained on a feed of fiber tows or tape by the fiber placement head assembly, feed rate of the tows or tape, laydown speed, operator overrides, heater current, fiber-placement head assembly temperature, ambient temperature that indicates a room temperature in the vicinity of the machine tool, ambient humidity that indicates the room humidity, material out time, machine maintenance, machine cleaning, and the like. The data may also include inconsistency data that indicates inconsistencies of one or more types of inconsistencies that may be spatially referenced to locations on the composite structure. Examples of suitable inconsistencies include gaps, laps, twists, wrinkles, puckers, bridges, folds, edge folds, untacked tows, edge placement inconsistencies, and the like.

The system 400 of example implementations of the present disclosure also includes a computer 406. In some examples, the computer is co-located or directly coupled to one or more of the machine tools 402. Additionally or alternatively, in some examples, the computer may communicate with one or more of the machine tools across one or more computer networks 408.

The computer 406 is configured to access design data 410. Design data, as used herein includes information about the structure describing the physical characteristics and manufacturing information. For example, design data 410 incudes a geometric model 412 of the composite structure 102, a layup design 414, and values of process parameters 416 according to which the layup is to be formed by the machine tool 402. More specific examples of design data include a three-dimensional (3D) geometry model of the composite structure, which may be produced from a commercially-available computer-aided design (CAD) system or the like. Other more specific examples include a treasure map or other table representing the composite structure geometry, a CNC program, layup geometry that may be produced from systems such as Vericut composite programming (VCP), process logs and the like.

In some examples, the design data 410 may include design and geometry features, which may be determined from or included in the geometric model 412 of the composite structure 102, and the layup design 414. These design and geometry features may be selected as those known to drive inconsistencies. Examples of suitable design and geometric features include stroke, normality that indicates the angle between the surface tangent plane underneath a compaction roller segment, and the plane tangent to the bottom of the compaction roller, the latter of which may be controlled by the fiber-placement head assembly normal, and the like. Other examples of suitable design and geometric features include curvatures (e.g., geodesic, total, normal), edge length difference & total arc length that indicates the total length of a tow and gives a representation of the amount of steering that has occurred during the laydown process, active tows or the number of total tows laid down in an individual pass of the layup, tow width, unsupported tow that may exist in high curvature regions where the machine tool may not contact the surface of the tool while material is laid, and the like.

The computer 406 is configured to apply the design data 410 to an artificial neural network (ANN) classifier 418 such as a feedforward ANN to classify a localized inconsistency 420 of a type of inconsistency on the composite structure 102, the localized inconsistency spatially referenced to a location on the composite structure. In some examples, the computer is configured to apply the data to feedforward ANN classifiers (multiple feedforward ANN classifiers) to classify localized inconsistencies of respective types of inconsistency on the composite structure.

In some examples, the computer 406 is configured to apply the design data 410 to cascading classifiers further including a recurrent neural network (RNN) 422 to which an output of the ANN classifier 418 is applied. In this regard, the design data is applied to the RNN to classify the localized inconsistency 420 of the type of inconsistency in time during the forming of the layup. The ANN classifier may be configured to perform a spatial analysis of inconsistency formation, and the RNN may be configured to perform a spatio-temporal analysis of inconsistency formation. One example of a suitable RNN is a long short-term memory (LSTM) network.

The computer 406 is configured to perform a root cause analysis 424 to identify one or more of the process parameters as a potential cause (e.g., a root cause) of the type of inconsistency (or potential causes of the respective types of inconsistency). This analysis may be performed to identify a variable or set of variables that may contribute to the creation of an inconsistency. A potential cause may include a root cause of the inconsistency, or another contributor to creation of the inconsistency.

The computer 408 is configured to modify one or more of the geometric model 412, the layup design 414 or the values of the one or more of the process parameters 416 to address the potential cause, and cause the machine tool 402 to form the layup according to the one or more of the geometric model, layup design or values of the process parameters including the values of the one or more process parameters as modified. The computer may determine one or more modifications either automatically, under direct operator control, or some combination of thereof. In this regard, in some examples, the computer is configured to determine one or more modifications automatically, that is, without being directly controlled by an operator. Additionally or alternatively, in some examples, the computer is configured to determine one or more modifications under direct operator control.

In some examples in which the machine tool 402 is a CNC machine 500, at least some of the values of the process parameters are specified by a CNC program 504 executable by the CNC machine to form the layup. In some of these examples, the computer 406 is configured to modify any of the values of the one or more of the process parameters that are specified by the CNC program, and thereby modify the CNC program, to address the potential cause. The computer is then configured to output the CNC program as modified to the CNC machine. In some further examples, the CNC program as modified is output to the CNC machine that includes a controller 502 configured to execute the CNC program to cause a fiber-placement head assembly 506 to travel a path over a work surface 510 and lay down a feed of fiber tows or tape 512 row-by-row to create a ply, and ply-by-ply to form the layup 514.

In some examples, the computer 406 is further configured to train the ANN classifier 418. In this regard, the computer is configured to access historical data 426 including observations of the process parameters 428 recorded during manufacture of other units of the composite structure 102. The historical data 426 further indicates any localized inconsistencies 430 of at least the type of inconsistency on the other units. The computer is configured to produce a training set 432 from the geometric model 412, the layup design 414, and the historical data for the composite structure. The training set includes the geometric model tessellated into discrete grids of locations on the composite structure (a tessellated model 434) with respective datasets 436 of localized ones of the observations 438 of the process parameters, and indicating the localized inconsistencies. And the computer is configured to train the ANN classifier using the training set including the geometric model.

In some examples, the computer 406 is configured to apply the design data 410 to the ANN classifier 418 to classify the locations on the composite structure 102 as including or excluding a respective inconsistency of the type of inconsistency.

Returning to FIG. 4, in some examples, the geometric model 412, the layup design 414, and the historical data 426 for the composite structure 102 are in different coordinate systems. This may include coordinate systems from a CAD system, treasure map, CNC program, VCP, process logs and the like. In some of these examples, the computer 406 configured to produce the training set 432 includes the computer configured to perform one or more coordinate transformations so that the layup design and the historical data for the composite structure are in a coordinate system of the geometric model.

Figure 6:
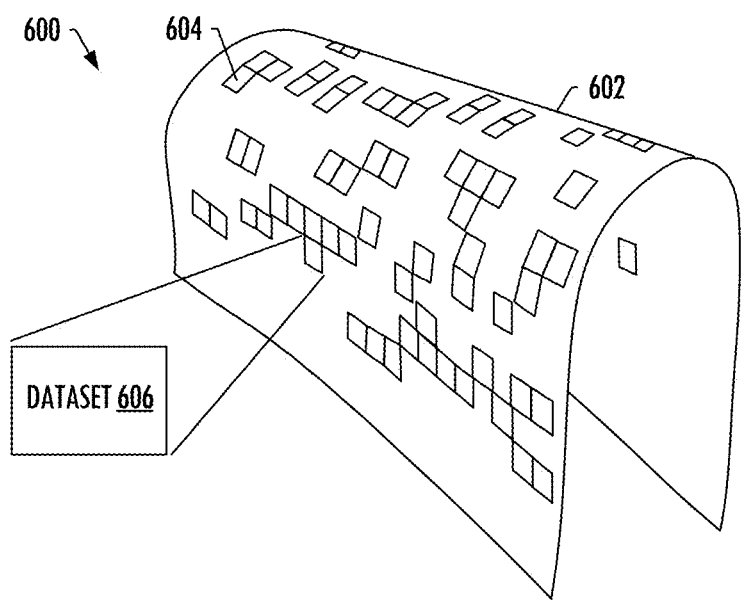
FIG. 6 illustrates an example training set including a tessellated model of a composite structure, according to some example implementations.

FIG. 6 illustrates an example training set 600 including a tessellated model 602 of a composite structure 102. As shown, the tessellated model includes discrete grids of locations 604 (only some of which are shown) with respective datasets 606 (one of which is shown) of localized process parameters, and indicating localized inconsistencies. The design data may also include localized design and geometry feature known to drive inconsistencies. In particular, for example, the dataset for each location may include at least some if not all of the following:

Design and Geometry Features:
  Stroke
  Normality
  Curvatures (e.g., geodesic, total, normal)
  Edge Length Difference
  Total Arc Length
  Active Tows
  Tow Width
  Unsupported Tow
Process Parameters:
  Compaction Force
  Tension
  Feed Rate
  Laydown Speed
  Operator Overrides
  Heater Current
  Fiber-Placement Head Assembly Temperature
  Ambient Temperature and Humidity
  Material Out Time
Inconsistency:
  Existence (Yes/No)
  Type The training set may therefore bin design and geometry features, and process parameters, into the correct locations on the composite structure to produce a contextualized model of data associated with the build process, and label each location with the inconsistencies that did occur, it they occurred.

Figure 7:
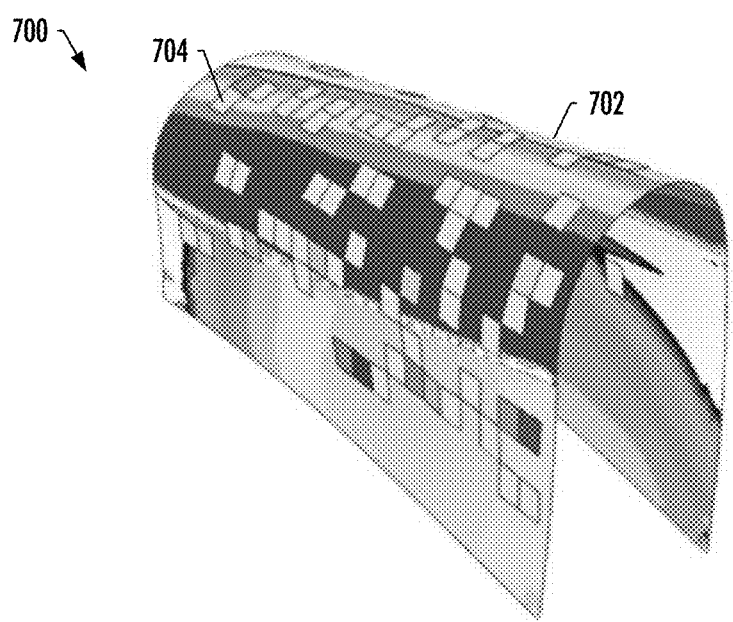
FIG. 7 illustrates a heat map of the composite structure in FIG. 6, according to some example implementations.

FIG. 7 illustrates a heat map 700 of the composite structure 102 in FIG. 6, according to some example implementations. The heat map also includes a tessellated model 702 of a composite structure. The tessellated model includes discrete grids of locations 704, and shows the probability of inconsistencies of a type of inconsistency as color, which may vary by hue or intensity depending on the probability of the locations being classified as including or excluding a respective inconsistency of the type of inconsistency.

Figure 8A:
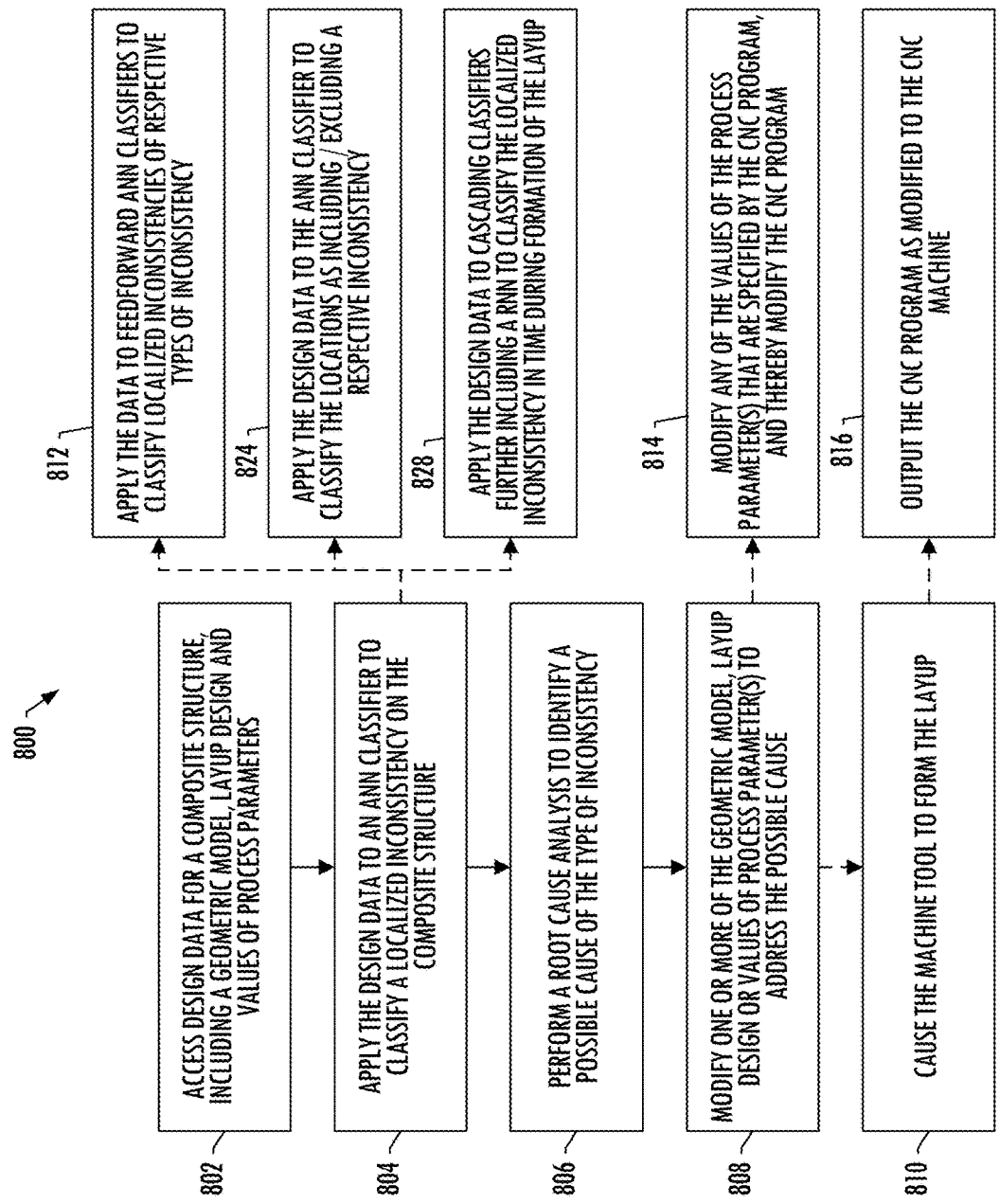
FIGS. 8A and 8B are flowcharts illustrating various operations in a method manufacturing a composite structure, according to example implementations.
Figure 8B:
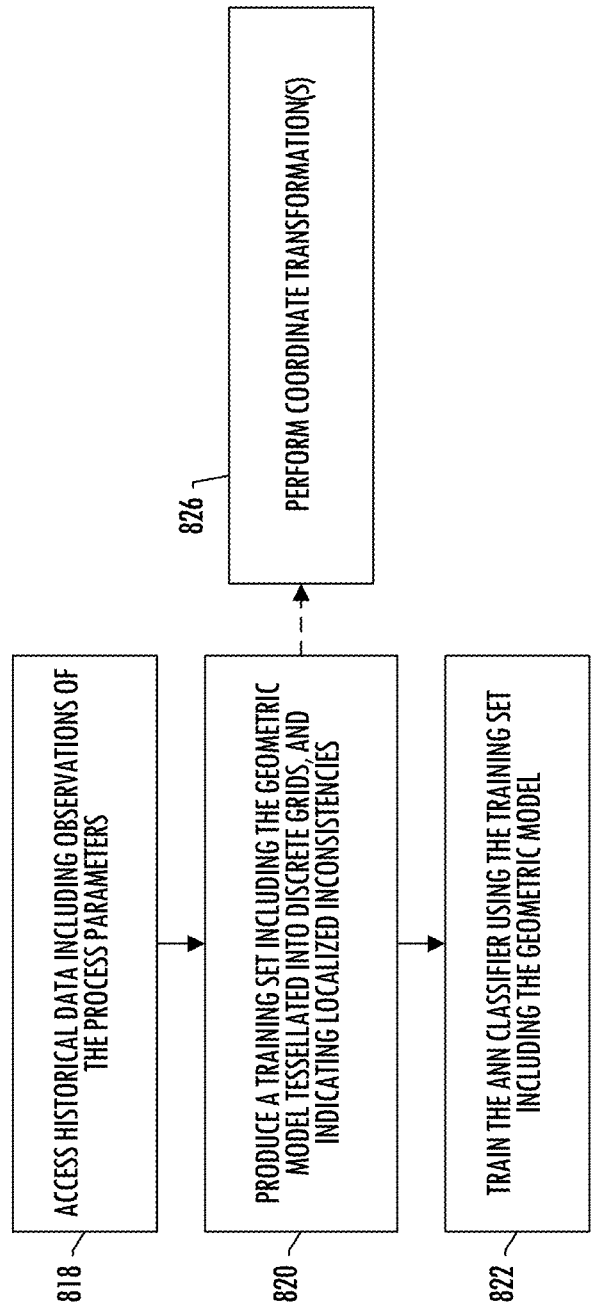

FIGS. 8A and 8B are flowcharts illustrating various operations in a method 800 of manufacturing a composite structure 102, according to example implementations of the present disclosure. As shown at block 802 of FIG. 8A, the method includes accessing design data for the composite structure. The design data includes a geometric model of the composite structure, a layup design, and values of process parameters according to which the layup is to be formed.

The method 800 includes applying the design data to an artificial neural network (ANN) classifier to classify a localized inconsistency of a type of inconsistency on the composite structure 102, as shown at block 804. In this regard, the localized inconsistency is spatially referenced to a location on the composite structure. The method also includes performing a root cause analysis to identify one or more of the process parameters as a potential cause of the type of inconsistency, and modifying one or more of the geometric model, the layup design, or the values of the one or more of the process parameters to address the potential cause, as shown at blocks 806 and 808. And in some further examples, the method includes causing the machine tool to form the layup according to the values of the process parameters including the values of the one or more process parameters as modified, as shown at block 810.

In some examples, the ANN classifier is a feedforward ANN classifier, and applying the data to the feedforward ANN classifier at block 804 includes applying the data to feedforward ANN classifiers to classify localized inconsistencies of respective types of inconsistency on the composite structure 102, as shown at block 812.

In some examples, the layup is to be formed by a machine tool that is a CNC machine, and at least some of the values of the process parameters are specified by a CNC program executable by the CNC machine to form the layup. In some of these examples, modifying one or more of the geometric model, the layup design, or the values of the one or more of the process parameters at block 808 includes modifying any of the values of the one or more of the process parameters that are specified by the CNC program, and thereby modifying the CNC program, to address the potential cause, as shown at block 814. Also in some of these examples, causing the machine tool to form the layup at block 810 includes outputting the CNC program as modified to the CNC machine, as shown at block 816. And in some further examples, the CNC program as modified is output to the CNC machine that includes a controller configured to execute the CNC program to cause a fiber-placement head assembly to travel a path over a work surface and lay down a feed of fiber tows or tape row-by-row to create a ply, and ply-by-ply to form the layup.

In some examples, the method 800 further includes accessing historical data including observations of the process parameters recorded during manufacture of other units of the composite structure 102, as shown at block 818 of FIG. 8B. The historical data further indicates any localized inconsistencies of at least the type of inconsistency on the other units. In some of these examples, a training set is produced from the geometric model, the layup design, and the historical data for the composite structure, as shown at block 820. The training set including the geometric model tessellated into discrete grids of locations on the composite structure with respective datasets of localized ones of the observations of the process parameters, and indicating the localized inconsistencies. The ANN classifier, then, is trained using the training set including the geometric model, as shown at block 822.

In further examples, applying the design data to the ANN classifier at block 804 includes applying the design data to the ANN classifier to classify the locations on the composite structure 102 as including or excluding a respective inconsistency of the type of inconsistency, as shown at block 824 of FIG. 8A.

In some examples, the geometric model, the layup design, and the historical data for the composite structure 102 are in different coordinate systems. In some of these examples, producing the training set at block 820 includes performing one or more coordinate transformations so that the layup design and the historical data for the composite structure are in a coordinate system of the geometric model, as shown at block 826 of FIG. 8B.

In some examples, applying the design data to the ANN classifier at block 804 includes applying the design data to cascading classifiers further including a RNN to which an output of the ANN classifier is applied, as shown at block 828 of FIG. 8A. In this regard, the design data is applied to the RNN to classify the localized inconsistency of the type of inconsistency in time during the forming of the layup.

According to example implementations of the present disclosure, the computer 406 may be implemented or otherwise executed by various means. These means may include hardware, alone or under direction of one or more computer programs from a computer-readable storage medium. In some examples, more than one computer may be configured to function as or otherwise implement the computer shown and described herein.

Figure 9:
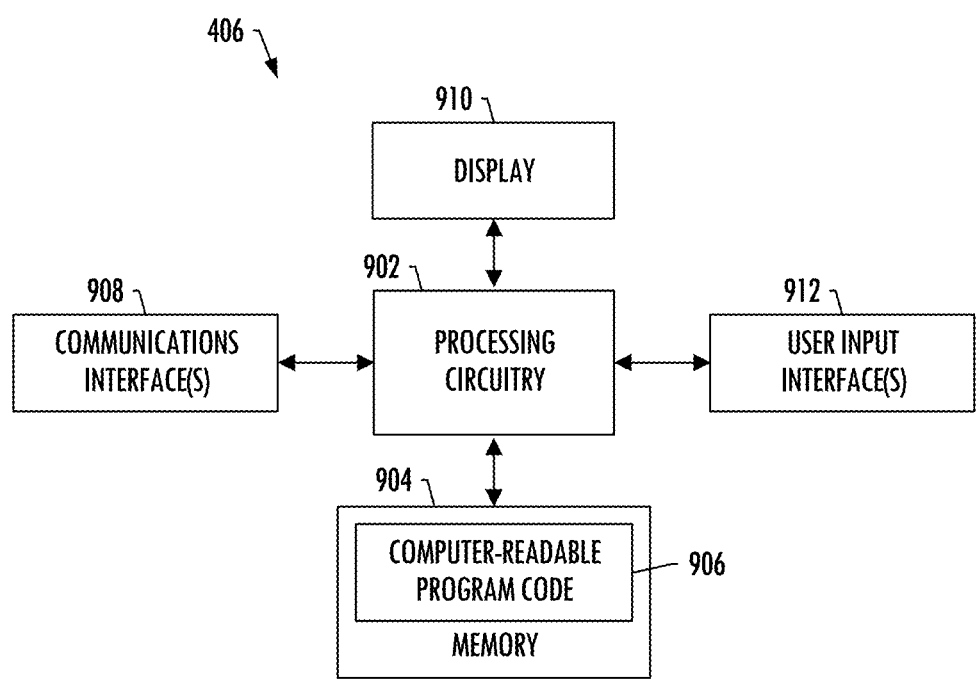
FIG. 9 illustrates a computer according to some example implementations.

FIG. 9 illustrates the computer 406 according to some example implementations of the present disclosure. Generally, the computer of example implementations of the present disclosure may comprise, include or be embodied in one or more fixed, portable or mobile electronic devices. The computer may include one or more of each of a number of components such as, for example, processing circuitry 902 (e.g., processor unit) connected to a memory 904 (e.g., storage device).

The processing circuitry 902 may be composed of one or more processors alone or in combination with one or more memories. The processing circuitry is generally any piece of computer hardware that is capable of processing information such as, for example, data, computer programs and/or other suitable electronic information. The processing circuitry is composed of a collection of electronic circuits some of which may be packaged as an integrated circuit or multiple interconnected integrated circuits (an integrated circuit at times more commonly referred to as a "chip"). The processing circuitry may be configured to execute computer programs, which may be stored onboard the processing circuitry or otherwise stored in the memory 904 (of the same or another computer).

The processing circuitry 902 may be a number of processors, a multi-core processor or some other type of processor, depending on the particular implementation. Further, the processing circuitry may be implemented using a number of heterogeneous processor systems in which a main processor is present with one or more secondary processors on a single chip. As another illustrative example, the processing circuitry may be a symmetric multi-processor system containing multiple processors of the same type. In yet another example, the processing circuitry may be embodied as or otherwise include one or more ASICs, FPGAs or the like. Thus, although the processing circuitry may be capable of executing a computer program to perform one or more functions, the processing circuitry of various examples may be capable of performing one or more functions without the aid of a computer program. In either instance, the processing circuitry may be appropriately programmed to perform functions or operations according to example implementations of the present disclosure.

The memory 904 is generally any piece of computer hardware that is capable of storing information such as, for example, data, computer programs (e.g., computer-readable program code 906) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 904, the processing circuitry 902 may also be connected to one or more interfaces for displaying, transmitting and/or receiving information. The interfaces may include communications interface(s) 908 (e.g., communications unit) and/or one or more user interfaces. The communications interface may be configured to transmit and/or receive information, such as to and/or from other computer(s), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 910 and/or user input interface(s) 912 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the computer, such as for processing, storage and/or display. Suitable examples of user input interfaces include a microphone, image or video capture device, keyboard or keypad, joystick, touch-sensitive surface (separate from or integrated into a touch-screen), biometric sensor or the like. The user interfaces may further include one or more interfaces for communicating with peripherals such as printers, scanners or the like.

As indicated above, program code instructions may be stored in memory, and executed by processing circuitry that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that may direct a computer, a processing circuitry or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processing circuitry or other programmable apparatus to configure the computer, processing circuitry or other programmable apparatus to execute operations to be performed on or by the computer, processing circuitry or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processing circuitry or other programmable apparatus provide operations for implementing functions described herein.

Execution of instructions by a processing circuitry, or storage of instructions in a computer-readable storage medium, supports combinations of operations for performing the specified functions. In this manner, the computer 406 may include a processing circuitry 902 and a computer-readable storage medium or memory 904 coupled to the processing circuitry, where the processing circuitry is configured to execute computer-readable program code 906 stored in the memory. It will also be understood that one or more functions, and combinations of functions, may be implemented by special purpose hardware-based computer systems and/or processing circuitry s which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated figures. Therefore, it is to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A computer for manufacturing a composite structure, the computer comprising:
   a memory configured to store computer-readable program code; and
   processing circuitry configured to access the memory, and execute the computer-readable program code to cause the computer to at least:
   access design data for the composite structure, the design data including a geometric model of the composite structure, a layup design of a layup of plies of fibers, and values of process parameters according to which the layup is to be formed;
   apply the design data to an artificial neural network (ANN) classifier to classify a localized inconsistency of a type of inconsistency on the composite structure, the localized inconsistency spatially referenced to a location on the composite structure;
   perform a root cause analysis to identify one or more of the process parameters as a potential cause of the type of inconsistency;
   access historical data including observations of the process parameters recorded during manufacture of other units of the composite structure, the historical data further indicating any localized inconsistencies of at least the type of inconsistency on the other units;
   produce a training set from the geometric model, the layup design, and the historical data for the composite structure, the training set including the geometric model tessellated into discrete grids of locations on the composite structure with respective datasets of localized ones of the observations of the process parameters, and indicating the localized inconsistencies; and
   modify one or more of the geometric model, the layup design, or the values of the one or more of the process parameters to address the potential cause.

2. The computer of claim 1, wherein the ANN classifier is a feedforward ANN classifier, and the computer caused to apply the design data to the feedforward ANN classifier includes the computer caused to apply the design data to feedforward ANN classifiers to classify localized inconsistencies of respective types of inconsistency on the composite structure.

3. The computer of claim 1, wherein the layup is to be formed by a machine tool that is a computer numerical control (CNC) machine, and at least some of the values of the process parameters are specified by a CNC program executable by the CNC machine to form the layup,
   wherein the computer caused to modify one or more of the geometric model, the layup design, or the values of the one or more of the process parameters includes the computer caused to modify any of the values of the one or more of the process parameters that are specified by the CNC program, and thereby modify the CNC program, to address the potential cause, and
   wherein the processing circuitry is configured to execute the computer-readable program code to cause the computer to further output the CNC program as modified to the CNC machine to cause the CNC machine to form the layup.

4. The computer of claim 3, wherein the CNC program as modified is output to the CNC machine that includes a controller configured to execute the CNC program to cause a fiber-placement head assembly to travel a path over a work surface and lay down a feed of fiber tows or tape row-by-row to create a ply, and ply-by-ply to form the layup.

5. The computer of claim 1, wherein the processing circuitry is configured to execute the computer-readable program code to cause the computer to further at least:
train the ANN classifier using the training set including the geometric model.

6. The computer of claim 5, wherein the computer caused to apply the design data to the ANN classifier includes the computer caused to apply the design data to the ANN classifier to classify the locations on the composite structure as including or excluding a respective inconsistency of the type of inconsistency.

7. The computer of claim 5, wherein the geometric model, the layup design, and the historical data for the composite structure are in different coordinate systems, and the computer caused to produce the training set includes the computer caused to perform one or more coordinate transformations so that the layup design and the historical data for the composite structure are in a coordinate system of the geometric model.

8. The computer of claim 1, wherein the computer caused to apply the design data to the ANN classifier includes the computer caused to apply the design data to cascading classifiers further including a recurrent neural network (RNN) to which an output of the ANN classifier is applied, the design data applied to the RNN to classify the localized inconsistency of the type of inconsistency in time during the forming of the layup.

9. A method of manufacturing a composite structure, the method comprising:
accessing design data for the composite structure, the design data including a geometric model of the composite structure, a layup design of a layup of plies of fibers, and values of process parameters according to which the layup is to be formed;
applying the design data to an artificial neural network (ANN) classifier to classify a localized inconsistency of a type of inconsistency on the composite structure, the localized inconsistency spatially referenced to a location on the composite structure;
performing a root cause analysis to identify one or more of the process parameters as a potential cause of the type of inconsistency;
accessing historical data including observations of the process parameters recorded during manufacture of other units of the composite structure, the historical data further indicating any localized inconsistencies of at least the type of inconsistency on the other units;
producing a training set from the geometric model, the layup design, and the historical data for the composite structure, the training set including the geometric model tessellated into discrete grids of locations on the composite structure with respective datasets of localized ones of the observations of the process parameters, and indicating the localized inconsistencies; and
modifying one or more of the geometric model, the layup design, or the values of the one or more of the process parameters to address the potential cause.

10. The method of claim 9, wherein the ANN classifier is a feedforward ANN classifier, and applying the design data to the feedforward ANN classifier includes applying the design data to feedforward ANN classifiers to classify localized inconsistencies of respective types of inconsistency on the composite structure.

11. The method of claim 9, wherein the layup is to be formed by a machine tool that is a computer numerical control (CNC) machine, and at least some of the values of the process parameters are specified by a CNC program executable by the CNC machine to form the layup,
wherein modifying one or more of the geometric model, the layup design, or the values of the one or more of the process parameters includes modifying any of the values of the one or more of the process parameters that are specified by the CNC program, and thereby modifying the CNC program, to address the potential cause, and
wherein the method further comprises outputting the CNC program as modified to the CNC machine to cause the CNC machine to form the layup.

12. The method of claim 11, wherein the CNC program as modified is output to the CNC machine that includes a controller configured to execute the CNC program to cause a fiber-placement head assembly to travel a path over a work surface and lay down a feed of fiber tows or tape row-by-row to create a ply, and ply-by-ply to form the layup.

13. The method of claim 9 further comprising:
training the ANN classifier using the training set including the geometric model.

14. The method of claim 13, wherein applying the design data to the ANN classifier includes applying the design data to the ANN classifier to classify the locations on the composite structure as including or excluding a respective inconsistency of the type of inconsistency.

15. The method of claim 13, wherein the geometric model, the layup design, and the historical data for the composite structure are in different coordinate systems, and producing the training set includes performing one or more coordinate transformations so that the layup design and the historical data for the composite structure are in a coordinate system of the geometric model.

16. The method of claim 9, wherein applying the design data to the ANN classifier includes applying the design data to cascading classifiers further including a recurrent neural network (RNN) to which an output of the ANN classifier is applied, the design data applied to the RNN to classify the localized inconsistency of the type of inconsistency in time during the forming of the layup.

17. A computer-readable storage medium for manufacturing a composite structure, the computer-readable storage medium being non-transitory and having computer-readable program code stored therein that, in response to execution by processing circuitry, causes a computer to at least:
access design data for the composite structure, the design data including a geometric model of the composite structure, a layup design of a layup of plies of fibers, and values of process parameters according to which the layup is to be formed;
apply the design data to an artificial neural network (ANN) classifier to classify a localized inconsistency of a type of inconsistency on the composite structure, the localized inconsistency spatially referenced to a location on the composite structure;
perform a root cause analysis to identify one or more of the process parameters as a potential cause of the type of inconsistency;

access historical data including observations of the process parameters recorded during manufacture of other units of the composite structure, the historical data further indicating any localized inconsistencies of at least the type of inconsistency on the other units;

produce a training set from the geometric model, the layup design, and the historical data for the composite structure, the training set including the geometric model tessellated into discrete grids of locations on the composite structure with respective datasets of localized ones of the observations of the process parameters, and indicating the localized inconsistencies; and modify one or more of the geometric model, the layup design, or the values of the one or more of the process parameters to address the potential cause.

18. The computer-readable storage medium of claim 17, wherein the ANN classifier is a feedforward ANN classifier, and the computer caused to apply the design data to the feedforward ANN classifier includes the computer caused to apply the design data to feedforward ANN classifiers to classify localized inconsistencies of respective types of inconsistency on the composite structure.

19. The computer-readable storage medium of claim 17, wherein layup is to be formed by a machine tool that is a computer numerical control (CNC) machine, and at least some of the values of the process parameters are specified by a CNC program executable by the CNC machine to form the layup, wherein the computer caused to modify one or more of the geometric model, the layup design, or the values of the one or more of the process parameters includes the computer caused to modify any of the values of the one or more of the process parameters that are specified by the CNC program, and thereby modify the CNC program, to address the potential cause, and wherein the computer-readable storage medium has further computer-readable program code stored therein that, in response to execution by the processing circuitry, causes the computer to further output the CNC program as modified to the CNC machine to cause the CNC machine to form the layup.

20. The computer-readable storage medium of claim 19, wherein the CNC program as modified is output to the CNC machine that includes a controller configured to execute the CNC program to cause a fiber-placement head assembly to travel a path over a work surface and lay down a feed of fiber tows or tape row-by-row to create a ply, and ply-by-ply to form the layup.

21. The computer-readable storage medium of claim 17, wherein the computer-readable storage medium has further computer-readable program code stored therein that, in response to execution by the processing circuitry, causes the computer to further at least:

train the ANN classifier using the training set including the geometric model.

22. The computer-readable storage medium of claim 21, wherein the computer caused to apply the design data to the ANN classifier includes the computer caused to apply the design data to the ANN classifier to classify the locations on the composite structure as including or excluding a respective inconsistency of the type of inconsistency.

23. The computer-readable storage medium of claim 21, wherein the geometric model, the layup design, and the historical data for the composite structure are in different coordinate systems, and the computer caused to produce the training set includes the computer caused to perform one or more coordinate transformations so that the layup design and the historical data for the composite structure are in a coordinate system of the geometric model.

24. The computer-readable storage medium of claim 17, wherein the computer caused to apply the design data to the ANN classifier includes the computer caused to apply the design data to cascading classifiers further including a recurrent neural network (RNN) to which an output of the ANN classifier is applied, the design data applied to the RNN to classify the localized inconsistency of the type of inconsistency in time during the forming of the layup.

* * * * *